United States Patent
Schwach et al.

(10) Patent No.: US 7,223,998 B2
(45) Date of Patent: May 29, 2007

(54) WHITE, SINGLE OR MULTI-COLOR LIGHT EMITTING DIODES BY RECYCLING GUIDED MODES

(75) Inventors: Carole Schwach, Ribeauville (FR); Claude Charles Aime Weisbuch, Paris (FR); Steven P. DenBaars, Goleta, CA (US); Henri Benisty, Palaiseau (FR); Shuji Nakamura, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 108 days.

(21) Appl. No.: 10/938,704

(22) Filed: Sep. 10, 2004

(65) Prior Publication Data
US 2006/0054905 A1    Mar. 16, 2006

(51) Int. Cl.
*H01L 27/15* (2006.01)
(52) U.S. Cl. .............. 257/86; 257/89; 257/98; 257/101; 257/102; 257/103; 257/E25.032
(58) Field of Classification Search .......... None
See application file for complete search history.

(56) References Cited

U.S. PATENT DOCUMENTS

| | | | |
|---|---|---|---|
| 3,739,217 A | 6/1973 | Bergh et al. | 313/499 |
| 5,226,053 A | 7/1993 | Cho et al. | 372/45.01 |
| 5,362,977 A | 11/1994 | Hunt et al. | 257/98 |
| 5,779,924 A | 7/1998 | Krames et al. | 216/24 |
| 5,995,529 A * | 11/1999 | Kurtz et al. | 372/45.01 |
| 6,163,038 A | 12/2000 | Chen et al. | 257/103 |
| 6,303,404 B1 | 10/2001 | Moon et al. | 438/46 |
| 6,504,180 B1 | 1/2003 | Heremans et al. | 257/98 |
| 6,525,464 B1 | 2/2003 | Chin | 313/499 |
| 6,538,371 B1 | 3/2003 | Duggal et al. | 313/486 |
| 6,608,330 B1 | 8/2003 | Yamada | 257/90 |
| 6,620,238 B2 | 9/2003 | Tsuda et al. | 117/90 |
| 6,620,643 B1 | 9/2003 | Koike | 438/30 |
| 6,630,691 B1 | 10/2003 | Mueller-Mach et al. | 257/84 |
| 2003/0057444 A1 | 3/2003 | Niki et al. | 257/200 |
| 2003/0178626 A1 | 9/2003 | Sugiyama et al. | |

FOREIGN PATENT DOCUMENTS

WO    WO 2005/064666    7/2005

OTHER PUBLICATIONS

Y. Kawakami et al., "Dimensionality of Excitons in InGaN-Based Light Emitting Devices", Phys. Stat. Sol. (a) 178, 331 (2000).

(Continued)

*Primary Examiner*—Leonardo Andujap
*Assistant Examiner*—Scott R. Wilson
(74) *Attorney, Agent, or Firm*—Gates & Cooper LLP

(57) ABSTRACT

A white, single or multi-color light emitting diode (LED) includes a mirror for reflecting photons within the LED; a first active region, adjacent the mirror, including one or more current-injected layers for emitting photons when electrically biased in a forward direction; a second active region, adjacent the first active region, including one or more optically-pumped layers for emitting photons, wherein the optically-pumped layers are optically excited by the photons emitted by the current-injected layers, thereby recycling guided modes; and an output interface, adjacent the second active region, for allowing the photons emitted by the optically-pumped layers to escape the LED as emitted light.

52 Claims, 14 Drawing Sheets

OTHER PUBLICATIONS

Y Ohba et al., "A study on strong memory effects for Mg doping in GaN metalorganic chemical vapor deposition", Journal of Crystal Growth 145 pp. 214-218 (1994).

Chen-Fu Chu et al., "Comparison of p-Side Down and p-Side Up GaN Light-Emitting Diodes Fabricated by Laser Life-Off", Jpn. J. Appl. Phys. vol. 42 (Feb. 15, 2003).

P.R. Tavernier et al., "Mechanics of laser-assisted debonding of films", Journal of Applied Physics, vol. 89 No. 3 (Feb. 1, 2001).

W.S. Wong et al., "Fabrication of thin-film InGaN light-emitting diode membranes by laser lift-off", Applied Physics Letters, vol. 75 No. 10 (Sep. 6, 1999).

X.A. Cao et al., "Electrical effects of plasma damage in p-GaN", Applied Physics Letters, vol. 75 No. 17 (Oct. 25, 1999).

Toshio Nishida et al., "Efficient and high-power AlGaN-based ultraviolet light-emitting diode grown on bulk GaN", Applied Physics Letters, vol. 79 No. 6 (Aug. 6, 2001).

A. Billeb et al., "Microcavity effects in GaN epitaxial films and in Ag/GaN/sapphire structures", Appl. Phys. Lett. 70 (21) (May 26, 1997).

W.S. Wong et al., "$In_xGa_{1-x}N$ light emitting diodes on Si substrates fabricated by Pd-In metal bonding and laser lift-off", Appl. Phys. Lett. vol. 77 No. 18 (Oct. 30, 2000).

J.J. Wierer et al., "High-power AlGaInN flip-chip light-emitting diodes", Applied Physics Letters, vol. 78 No. 22 (May 28, 2001).

M.S. Minsky et al., "Room-temperature photoenhanced wet etching of GaN", Appl. Phys. Lett 68 (11) (Mar. 11, 1996).

C. Youtsey et al., "Gallium nitride whiskers formed by selective photoenhanced wet etching of dislocations", Applied Physics Letters, vol. 73 No. 6 (Aug. 10, 1998).

H. Benisty et al., "Impact of planar micro-cavity effects on light extraction—basic concepts and analytical trends," 1998, IEEE J. Quantum Electron, 34:1612.

M. Boroditsky et al., "Light extraction efficiency from light-emitting diodes," 1997, Proceedings of the SPIE—The International Society for Optical Engineering, SPIE-Int. Soc. Opt. Eng., 3002:119-122.

D. Delbeke et al., "High-efficiency Semiconductor Resonant-Cavity Light-Emitting diodes: A review," 2002, IEEE J. on selected topic in Quantum Electron, 8(2):189.

X. Guo et al., "Phonton Recycling Semiconductor Light Emitting diode," 1999, IEDM Technical Digest, IEDM-99, p. 600.

I. Schnitzer et al., "30% Enternal Quantum Efficiency From Surface Textured, Thin Film Light Emitting Diode," 1993, Applied Physics Letters, 63:2174-2176.

* cited by examiner

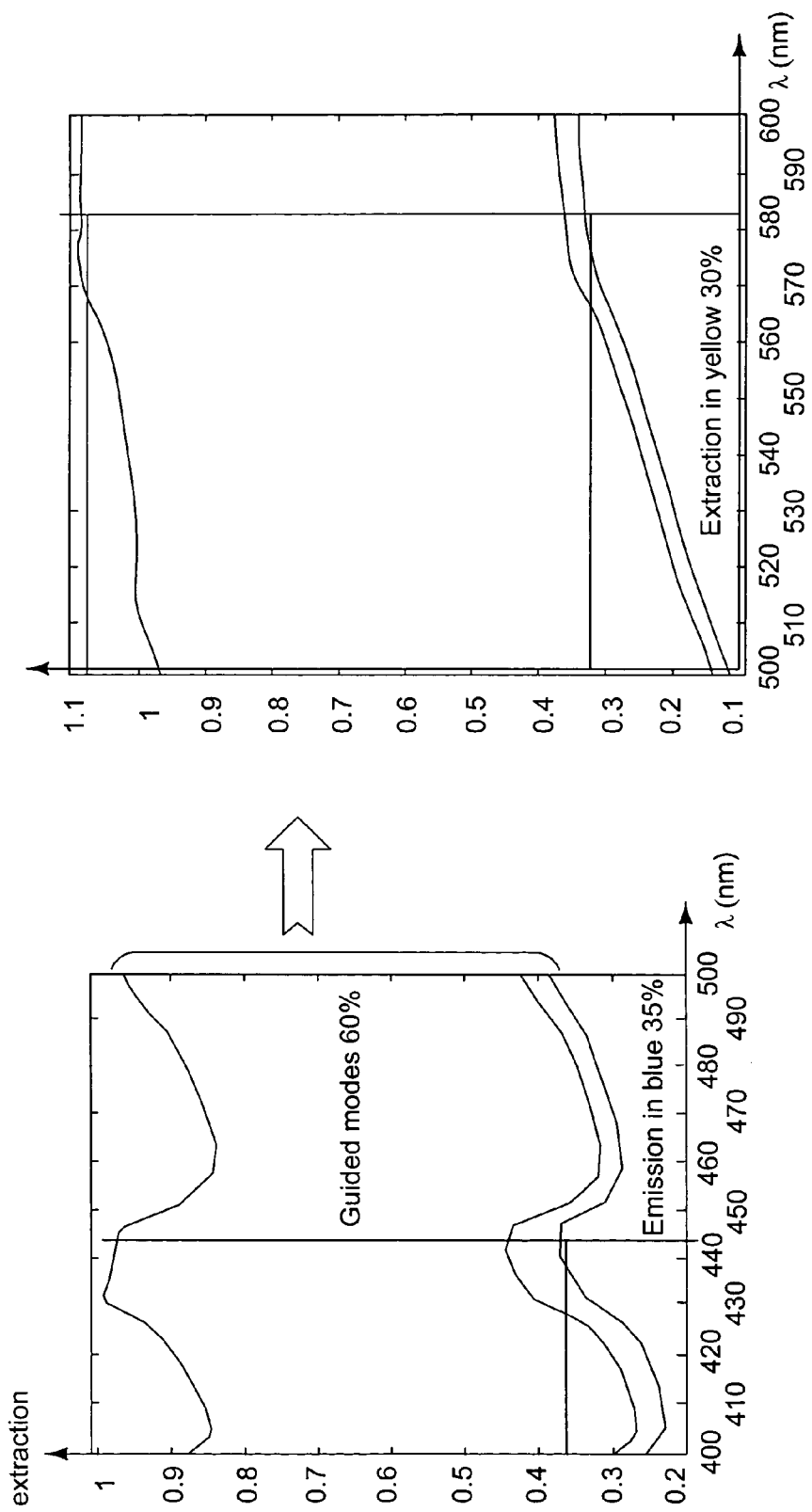

WHITE, SINGLE OR MULTI-COLOR LIGHT EMITTING DIODES BY RECYCLING GUIDED MODES

BACKGROUND OF THE INVENTION

1. Field of the Invention

The invention is related to light emitting diodes (LEDs), and more particularly, to new structures for producing white, single or multi-color LEDs with high extraction efficiency by recycling guided modes.

2. Description of the Related Art (Note: This application references a number of different publications and patents as indicated throughout the specification by one or more reference numbers within brackets, e.g., [x]. A list of these different publications and patents ordered according to these reference numbers can be found below in the section entitled "References." Each of these publications and patents is incorporated by reference herein.)

A light emitting diode (LED) is a semiconductor device that emits light when electrically biased in the forward direction. This effect is a form of electroluminescence.

LEDs are typically comprised of a chip of semiconducting material impregnated or doped with impurities to create a structure known as a pn junction. When forward biased, electrons are injected into the pn junction from an n-region of the device and holes are injected into the pn junction from a p-region of the device. The electrons and holes release energy in the form of photons as they recombine. The wavelength of the light, and therefore its color, depends on the bandgap energy of the materials forming the pn junction.

As semiconductor materials have improved, the efficiency of LEDs has also improved, and new wavelength ranges have been used. For example, gallium nitride (GaN) based LEDs are probably the most promising for a variety of applications. GaN provides efficient illumination in the ultraviolet (UV) to amber spectrum, when alloyed with varying concentrates of indium (In), for example.

Unfortunately, most of the light emitted within an LED is lost due to internal reflections at the semiconductor-air interface. Typical semiconductor materials have a high index of refraction, and thus, according to Snell's law, most of the light will remain trapped in the materials, thereby degrading efficiency. However, by choosing a suitable geometry for the LED, a higher extraction efficiency can be achieved, wherein extraction efficiency refers to the ability of the photons generated by a particular system to actually escape the materials as "useful" radiation, i.e., extracted light.

FIG. 1 is a cross-sectional view of a semiconductor LED 100 that illustrates how a portion of the light 102 emitted from a QW 104 traverses an escape cone 106 in order to be extracted from the device 100, while a large fraction of the emitted light 108 is trapped and reflected within the device 100. In this situation, the reflected light 108 is referred to as guided light modes, or guided modes, because the light 108 is confined within the device 100 and guided transversely within the semiconductor materials comprising the device 100.

One method to reduce the effects of the internal reflection is to create light redistribution through random texturing of the surface of the device, which leads to multiple variable-angle incidence at the semiconductor-air interface of the device.

FIG. 2 is a cross-sectional view of a semiconductor LED 200 that illustrates this concept, wherein the top surface 202 of the LED 200 is textured, the bottom surface 204 of the LED 200 comprises a reflector, the air is shown to have a refractive index of n=1, and the semiconductor material of the LED 200 is shown to have a refractive index of n=3.5.

The textured-surface approach has been shown to improve emission efficiency to approximately 9–40%, due to the very high internal efficiency and low internal losses of the device, which allows many reflections or passes for the emitted light before it is extracted from the device. [1,2]

Another method to reduce the percentage of light trapped is to use a micro-cavity LED (MCLED), also known as a resonant cavity LED (RCLED). [3,4] MCLEDs offer opportunities to create solid-state lighting systems with greater efficiencies than existing systems using traditional LEDs. As a result of incorporating an active medium within a resonant cavity, MCLEDs emit a highly compact and directional light beam. The higher extraction efficiency and greater brightness of these devices are their main advantages over conventional LEDs. This higher extraction efficiency is, however, limited to values in the 40% range as the micro-cavity structure also leads to very efficient emission into guided modes. Thus, it would be useful if these guided modes could be extracted.

Beyond simple monochrome LEDs, the generation of high-efficiency, good color-rendering, white LEDs is one of the most important goals the industry is trying to achieve. White light is currently made in one of two ways:

1. By selectively combining the proper combination of red, green and blue (RGB) LEDs. However, this solution is costly and the overall light output of each RGB LED degrades at a different rate, thereby resulting in an eventual color imbalance.
2. By using a phosphor coating, typically yttrium aluminum garnet (YAG), on a surface of a blue LED. The blue LED excites the phosphor, thereby causing it to glow white (Nichia). This is the dominant method of achieving white light output. Alternatively, this method may use a UV-emitting LED in combination with a luminescence conversion LED (LUCOLED).

FIG. 3A is a cross-sectional view of the structure of a white LED 300 comprised of a gallium indium nitride (GaInN) blue LED die 302, a phosphor-containing epoxy 304 encapsulating the die 302, and bond wires 306 leading from the die 302 to a package 308, which is sealed by a cap 310. FIG. 3B is a cross-sectional view that illustrates the wavelength-converting phosphorescence 312 and blue luminescence 314.

The problems with the structure of FIGS. 3A and 3B are the poor efficiencies of the LED, the optical coupling between the LED and phosphor, the low brightness, and the non-planar fabrication technique.

Another structure that may be used to obtain a white LED is the photon recycling semiconductor LED (PRS-LED), which comprises an epitaxially-grown indium gallium nitride (InGaN) based blue LED bonded to a second wafer containing an aluminum gallium indium phosphide (AlGaInP) active region. FIG. 4 is a cross-sectional view of the structure of a PRS-LED 400, wherein the PRS-LED 400 is comprised of a sapphire substrate 402, a p-GaN layer 404, a primary InGaN active region 406 emitting light 408 in the blue wavelength range, an n-GaN layer 410, and an electrically-inactive AlGaInP photon recycling wafer 412 re-emitting a complementary colored light 414, such as yellow/orange. A p-type contact 416 and n-type contact 418 are placed on the bottom of the PR+S-LED 400.

The first PRS-LED was demonstrated as a hybrid device by Guo and colleagues in 1999. [5] This device emits two discrete wavelengths, and the combined output should be perceived as white light. The PRS-LED can also be designed to emit other colors by the proper combination of emitting species, which is not possible with conventional LEDs. In addition, more recycling layers are possible, giving rise to bi-chromatic and tri-chromatic PRS-LEDs. The drawbacks here are the mediocre optical coupling efficiency between emitters and the poor efficiency of the active blue LED.

Notwithstanding the above, what is needed in the art are new LED structures that provide white, single or multi-color light and increased light extraction efficiency, while retaining a planar structure, so that they are easily manufacturable at low cost. The present invention solves that need.

SUMMARY OF THE INVENTION

The present invention discloses a white, single or multi-color light emitting diode (LED) comprising a mirror for reflecting photons within the LED; a first active region, adjacent the mirror, comprised of one or more current-injected layers for emitting photons when electrically biased in a forward direction; a second active region, adjacent the first active region, comprised of one or more optically-pumped layers for emitting photons, wherein the optically-pumped layers are optically excited by the photons emitted by the current-injected layers, thereby recycling guided modes; and an output interface, adjacent the second active region, for allowing the photons emitted by the optically-pumped layers to escape the LED as emitted light.

The mirror, which usually is also a contact layer, reflects an energy flux from the first active region and thus multiplies the photons emitted from the current-injected layers that optically excite the optically-pumped layers in the second region. In one embodiment, the current-injected layer lies at an antinode of an electric field of an optical wave to the mirror to enhance coupling effects. A value "d" represents a distance between the mirror and the first active region, such that:

$d=\lambda/4$ or $\lambda/4+n\ \lambda/2$ (approximately) for a metallic mirror, or $d=\lambda/2$ or $\lambda/2+n\ \lambda/2$ for a distributed Bragg reflector (DBR) mirror, where $\lambda$ is the wavelength of the optical wave. Moreover, a thickness of the first region is adjusted so as to obtain a micro-cavity enhancement effect due to reflections at the mirror and at an interface between the first and second regions. Consequently, the first and second active regions are close and are not separated by a substrate in order to achieve an efficient recycling.

The first active region is comprised of doped materials, and the current-injected layers are electrically-active layers. Moreover, the current-injected layers of the first active region comprise emitters such as quantum wells (QWs) or quantum dots (QDs).

In contrast, the second active region is comprised of undoped materials, and the optically-pumped layers comprise electrically-passive layers. Moreover, the optically-pumped layers are comprised of quantum wells (QWs), quantum dots (QDs), phosphors, dyes, light emitting polymers, or other light emitting molecules, wherein any color of light is achieved by combining emitters at desired wavelengths in the optically-pumped layers.

The optically-pumped layers are optically-pumped by the guided modes of the current-injected layers, absorb the guided modes and re-emit the absorbed guided modes at the same or different wavelengths as the current-injected layers.

The photons emitted by the optically-pumped layers escape the LED as emitted light through an output interface comprising a textured surface, a distributed Bragg reflector (DBR), an epoxy structure, or other structure. Further, an epoxy dome may be added on the output interface to increase an escape cone.

BRIEF DESCRIPTION OF THE DRAWINGS

Referring now to the drawings in which like reference numbers represent corresponding parts throughout:

FIGS. 12A–12B are graphs showing the extraction percentage versus wavelength for the light emitting diode of FIG. 11, wherein FIG. 12A shows the emission from the current-injected layer, while FIG. 12B shows the emission from the optically-pumped layer;

FIGS. 14A–14B are graphs showing the extraction percentage versus wavelength for the light emitting diode of FIG. 13, wherein FIG. 14A shows the emission from the current-injected layer, while FIG. 14B shows the emission from the optically-pumped layer;

FIGS. 16A–16B are graphs showing the extraction percentage versus wavelength for the light emitting diode of FIG. 15, wherein FIG. 16A shows the emission from the current-injected layer, while FIG. 16B shows the emission from the optically-pumped layer.

DETAILED DESCRIPTION OF THE INVENTION

Figure 1:
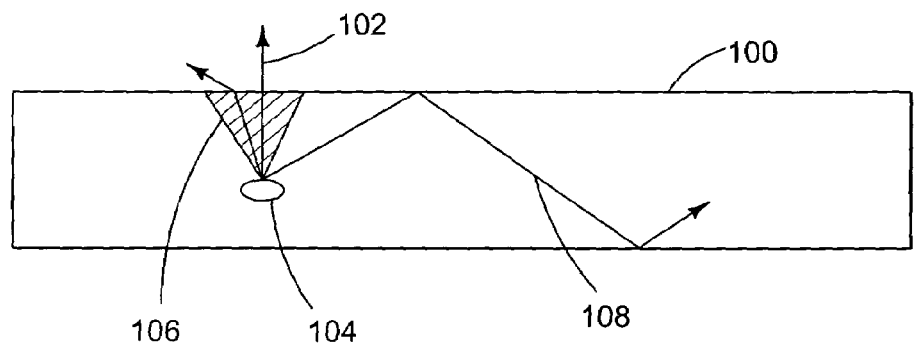
FIG. 1 is a cross-sectional view of a semiconductor light emitting diode.
Figure 2:
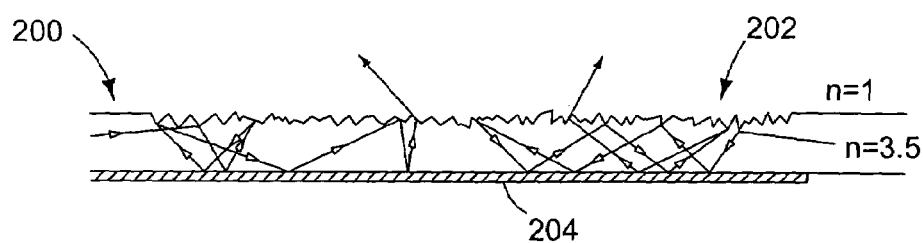
FIG. 2 is a cross-sectional view of a semiconductor light emitting diode with a textured surface.
Figure 3A:
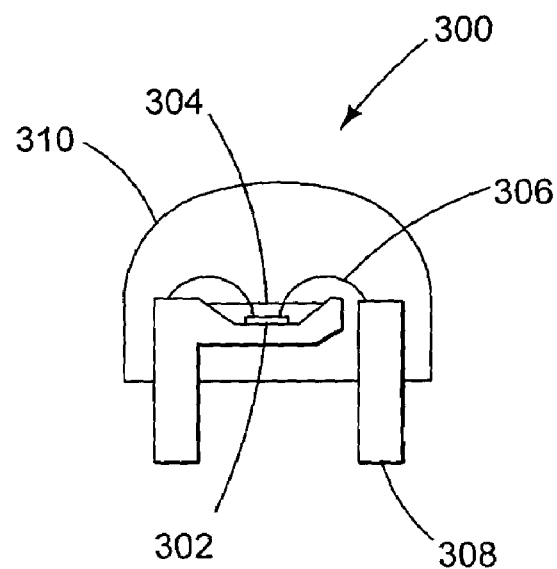
FIGS. 3A and 3B are cross-sectional views of light emitting diodes with a phosphor-containing epoxy encapsulating the die.
Figure 3B:
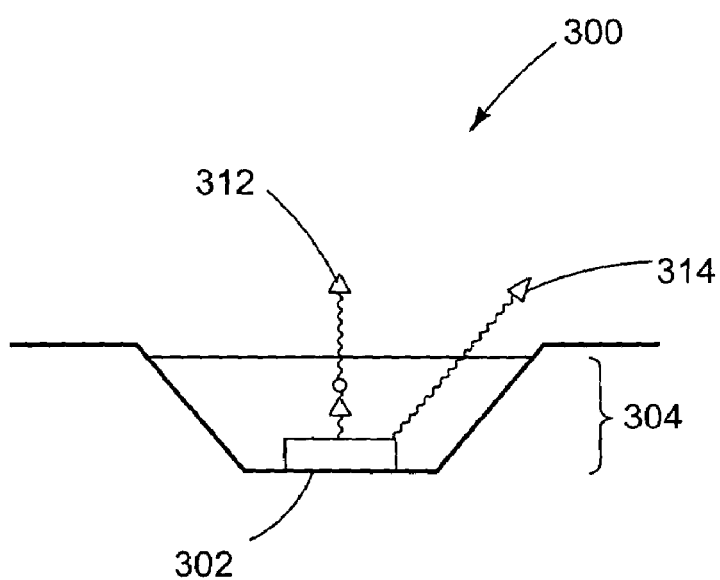
Figure 4:
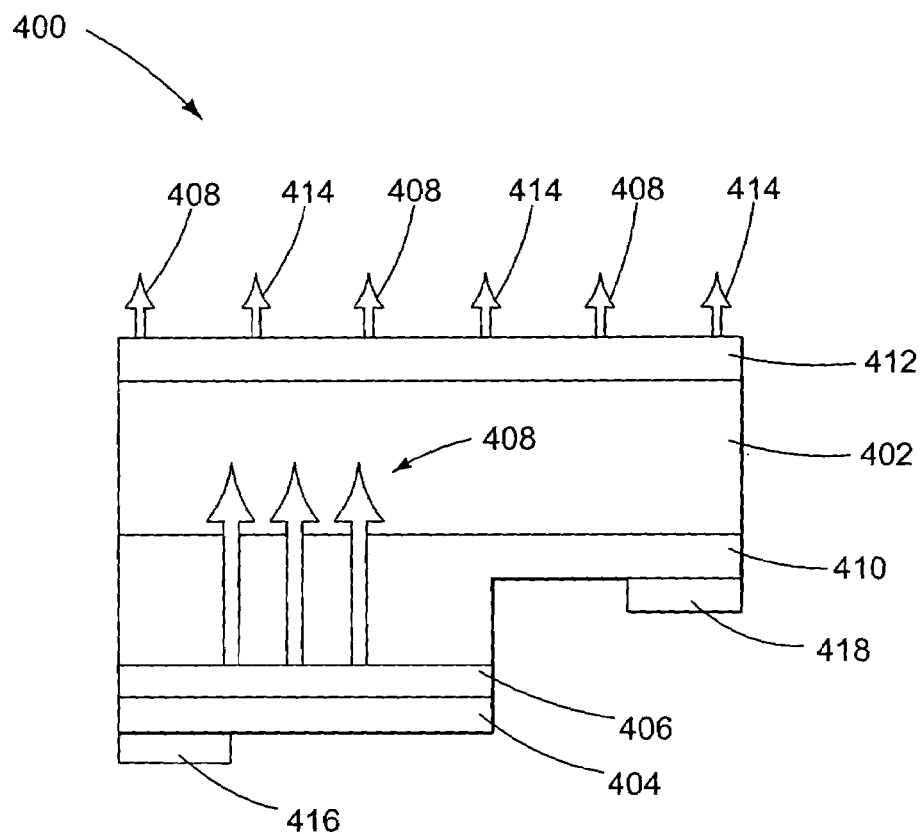
FIG. 4 is a cross-sectional view of a photo recycling semiconductor light emitting diode.

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes new LED structures that provide white, single or multi-color light and increased light extraction efficiency while retaining a planar structure. The new LED structures have direct emission outside the structure and, in addition, convert guided light in different colors through absorption and re-emission by additional emitting species, to achieve a high-efficiency white, single or multi-color LED.

The structure includes a bottom mirror, one or more current-injected layers, one or more electrically-passive, optically-pumped layers for recycling photons generated by the current-injected layers, which are emitted at a same or longer wavelength, with the emitted light escaping through a top output interface. Preferably, the LED structure is thin enough to efficiently recycle the guided modes.

The current-injected layers may comprise quantum wells (QWs) or quantum dots (QDs), while the optically-pumped layers may comprise quantum wells (QWs), quantum dots (QDs), phosphors, dyes, light emitting polymers, light emitting molecules, such as aluminum tris(8-hydroxyquinoline), etc. The emitters in the current-injected layers and the optically-pumped layers may output single or multiple wavelengths of light in order to provide better color rendering properties.

The bottom mirror may be a metallic mirror, a composite metal-dielectric mirror, or a distributed Bragg reflector (DBR), and can also be used as a contact layer. The top output interface comprises either a textured surface, a distributed Bragg reflector (DBR), an epoxy structure, or some other structure, wherein a layer of epoxy may be added to the top output interface.

The efficiency of the new LED structures is increased by the fact that the guided modes that are usually lost are recycled. The new LEDs retain a planar single layer structure, making them easily manufacturable at low cost.

Such photon recycling concepts for guided light (i.e., internally reflected at the medium-air interfaces) are equally applicable to any emitter, such as displays, and are quite independent of the materials systems used.

White, single or multi-color LEDs have many possible applications, including signage, displays, automotive lights, and other illumination applications, such as street illumination, that require excellent efficiency. In the longer term, general purpose lighting can use white LEDs. By using different emitters at different colors, the present invention is able to perform good color rendering and high-quality illumination. A big advantage of the LED structure of the present invention is that it can allow the properties for the type and quality of light produced to be tailored by adding emitters of various colors.

LED Structure

The present invention uses a thin film LED structure that is able to efficiently recycle guided modes within the LED. This is based on the fact that, in an LED, some light that cannot be extracted is either absorbed in the contacts, reabsorbed by the active layer (eventually giving rise to further emission by photon auto-recycling), dissipated by defects or free carrier absorption, or reflected within the LED as guided modes (for a large part).

LEDs of the present invention include a second active region to recycle the "lost" photons of these guided modes; thus, the "lost" photons are reused. This second active region comprises one or more optically-pumped layers that are optically-pumped by the guided modes of one or more current-injected layers of a first active region. The second active region absorbs the guided modes and then re-emits at the same or different wavelengths.

The second active region may be comprised of emitter species such as QWs of any kind, such as InGaN (Zn:Si), QDs, phosphors, dyes, light emitting polymers, or light emitting molecules. Quite often, these species have excellent photoluminescence efficiencies, but are often difficult to excite electrically. In the present invention, these species are used in a most favorable implementation, that of photo-excitation.

The same structure can also be used to perform higher extraction in only one color, wherein the optically-pumped layer is designed so that it emits at the same or at a nearby wavelength as the current-injected layer. The advantage compared to the other structures, where the electrically-pumped layer is reabsorbing the guided light and performing the photon recycling, is that the optically-pumped layers performing the recycling are located in undoped materials. Therefore, free-carrier absorption, which is a major loss mechanism, is generally absent. Moreover, any type of color can be achieved by combination of well-chosen emitters at desired wavelengths.

To achieve an efficient recycling, the two active regions must be close and not separated by a sapphire substrate (or other substrate) as described in [5]; thus, the total size of the device should be relatively thin (e.g., the thickness of the two emitting layers should not be much greater than about 10 light wavelengths).

A bottom mirror with high reflectivity is added to reflect a downward energy flux from the first active region and thus multiplies (e.g., by 2) the photons emitted from the first active region that optically excite the second active region. The bottom mirror is also used as a contact layer. This mirror can either be aluminum, rhodium, silver, a DBR, or any other material or structure, so long as it yields high reflectivity combined with good contact properties.

The current-injected layer should lie at an antinode of an electric field of an optical wave close to the mirror to enhance the effects of the coupling. If placed at an antinode, the emission from the current-injected layer will be multiplied (e.g., by 4).

The photons emitted from the second active region escape the LED through an output interface on top of the LED. The output interface may comprise a textured surface, a DBR, an epoxy structure, or some other structure. Generally, the textured surface provides for chaotic light ray trajectories, which will impinge, after a few reflections at most, within the escape angle of the semiconductor-air interface. On the other hand, the DBR will typically be centered on the blue wavelength (if blue is emitted by the electrically-injected layer) to allow non-blue light to escape at once. Finally, epoxy can be added on the top to increase the escape cone if needed and thus also increase the light extracted (e.g., by a factor of 2).

Various alternative embodiment of the present invention are described in more detail below.

Figure 5A:
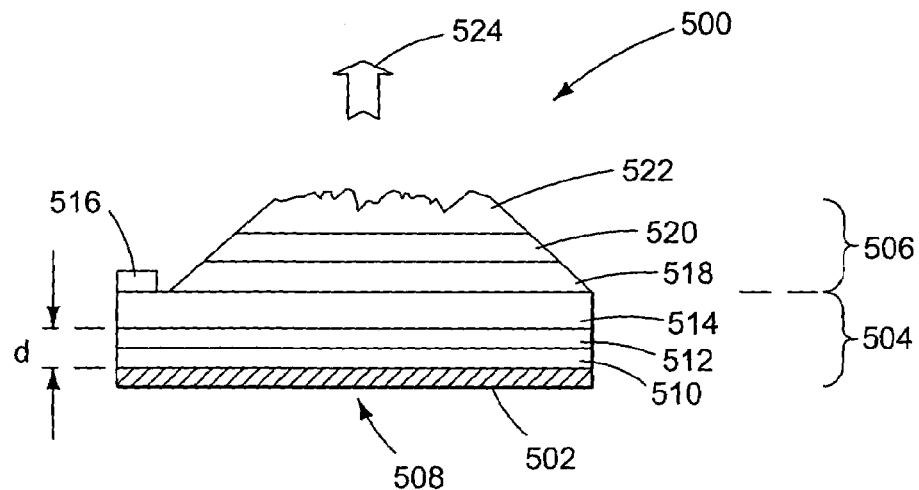
FIGS. 5A–5B are cross-sectional views of light emitting diodes according to one embodiment of the present invention.
Figure 5B:
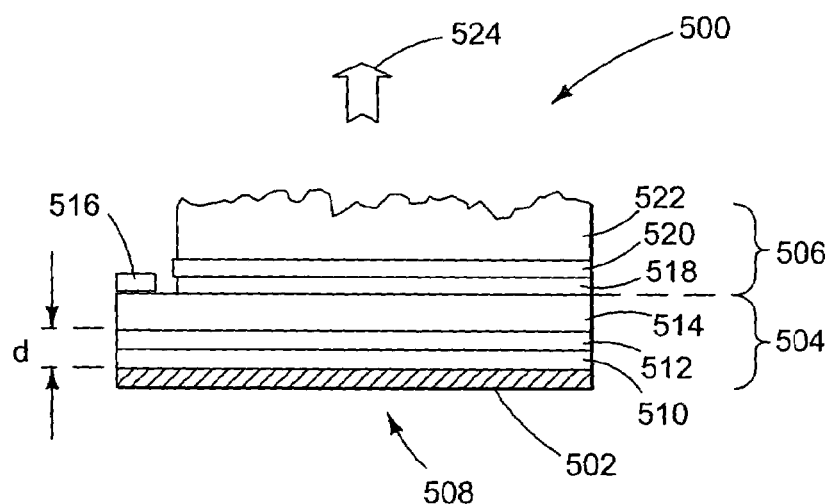

FIGS. 5A and 5B are cross-sectional views of the structure of LEDs 500 according to the present invention, which include textured surfaces and multiple QWs. Each LED 500 includes a high-reflectivity mirror 502, a doped first region 504, and an undoped second region 506. The high-reflectivity mirror 502 is also used as a p-contact 508. The doped first region 504 includes a p-GaN layer 510, current-injected QWs layer 512 and n-GaN layer 514. The upper surface of the n-GaN layer 514 includes an n-contact 516. The undoped second region 506 includes an undoped GaN layer 518, optically-pumped QWs layer 520 and an undoped GaN layer 522, wherein the undoped GaN layer 522 includes a textured surface from which light 524 escapes.

Only the QWs 512 in the first region 504 are current-injected, while the QWs 520 in the second region 506 are optically-pumped by the light generated by the QWs 512 in the first region 504, and thus the p-contact 502 needs to be created close to the QWs 512. The value d represents the distance between the p-contact 502 and the QWs 512, and comprises:

$$d=\lambda/4 \text{ or } \lambda/4+n\ \lambda/2 \text{ (approximately) for a metallic mirror 502}$$

$$d=\lambda/2 \text{ or } \lambda/2+n\ \lambda/2 \text{ for a DBR mirror 502}$$

where $\lambda$ is the wavelength of the emitted light.

Consequently, for a metallic mirror 502, the emitting QWs layer 512 is placed about $\lambda/4$ or $\lambda/4+n\ \lambda/2$ from the bottom metallic mirror 502, and the thickness of the first region 504 is adjusted so as to obtain a micro-cavity enhancement effect due to the reflections at the bottom mirror 502 and at the interface between the first and second regions 504 and 506. Similarly, for a DBR mirror 502, the emitting QWs layer 512 is placed about $\lambda/2$ or $\lambda/2+n\ \lambda/2$ from the bottom DBR mirror 502, and the thickness of the first region 504 is adjusted so as to obtain a micro-cavity enhancement effect due to the reflections at the bottom mirror 502 and at the interface between the first and second regions 504 and 506.

The current-injected QWs 512 can emit light either in the blue or UV range. If UV QWs 512 are used, then a UV-mirror needs to be placed on top of the device 500, so that the UV light is not extracted, but other wavelengths are extracted. To produce white light, at least two or more optically-pumped QWs 520 are needed.

The size of the surface texturing of the layer 522, e.g., the roughness on an output interface of second region 506, should be approximately $\lambda/2$ or larger. Light randomization allows each photon to bounce a few times inside the device 500 before it escapes, and thus ensures better re-emission of the non-injected QWs 520 and also better color mixing.

The mesa formed by the second region 506 could either be square or cut by an angle. Moreover, such shaping can be used to redirect the light escaping from the device 500.

Eventually, the optical randomization could be created in the second region 506 when using phosphor particles with sizes 0.1-1 μm and an index of refraction different from the surrounding layer material.

Figure 6A:
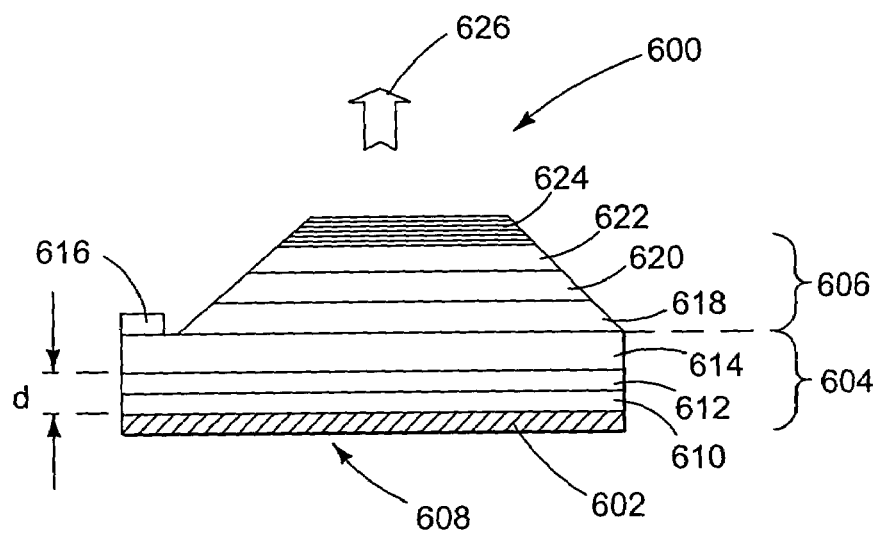
FIGS. 6A–6B are cross-sectional views of light emitting diodes according to one embodiment of the present invention.
Figure 6B:
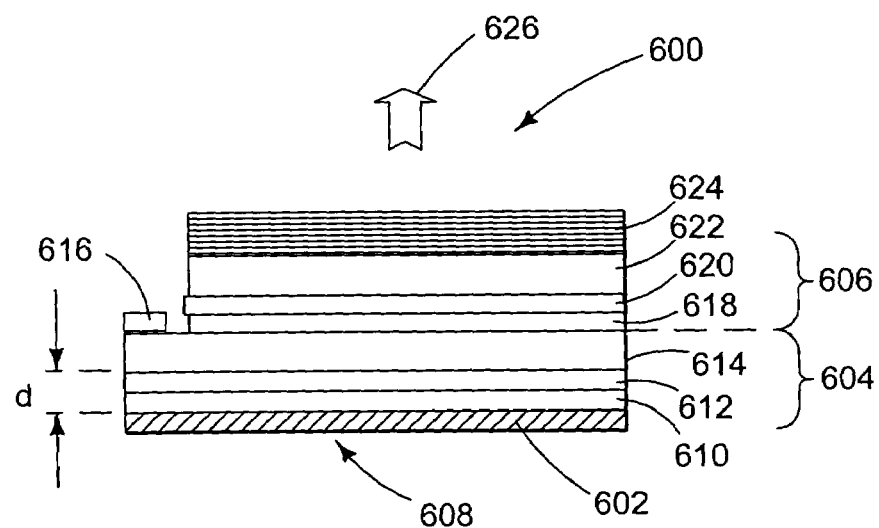

FIGS. 6A and 6B are cross-sectional views of the structure of LEDs according to the present invention, which include MCLEDs and multiple QWs. Each LED 600 includes a high-reflectivity mirror 602, a doped first region 604, and an undoped second region 606. The high-reflectivity mirror 602 is also used as a p-contact 608. The doped first region 604 includes a p-GaN layer 610, current-injected QWs layer 612 and n-GaN layer 614. The upper surface of the n-GaN layer 614 includes an n-contact 616. The undoped second region 606 includes an undoped GaN layer 618, optically-pumped QWs layer 620, undoped GaN layer 622, and DBR mirror 624 from which light 626 escapes, wherein the DBR mirror 624 is centered on the blue wavelength. Alternatively, epoxy may be used instead of or in addition to the DBR mirror 624.

In this structure, light extraction out of the second region 606 is provided by the DBR mirror 624 at the blue wavelength of the QWs 612 emissions from the first region 604, thus creating a micro-cavity enhancement effect for that emission. The DBR mirror 624 might be ineffective for emissions from the second region 606, or by proper adjustment of overall structure thickness, a double micro-cavity effect could be achieved for both emitted light wavelengths by using a DBR mirror 624 efficient at both wavelengths.

As mentioned above, instead of putting a DBR mirror 624 on top of the second region 606, epoxy may be used instead, which increases the escape cones for both wavelengths. A semiconductor-epoxy interface also acts as a weak mirror (e.g., by means of fresnel reflectivity) to create a weak micro-cavity effect, which is provided by the overall optical thickness in a number of $\lambda/2$ (including the metal dephasing of about $\lambda/4$).

Figure 7:
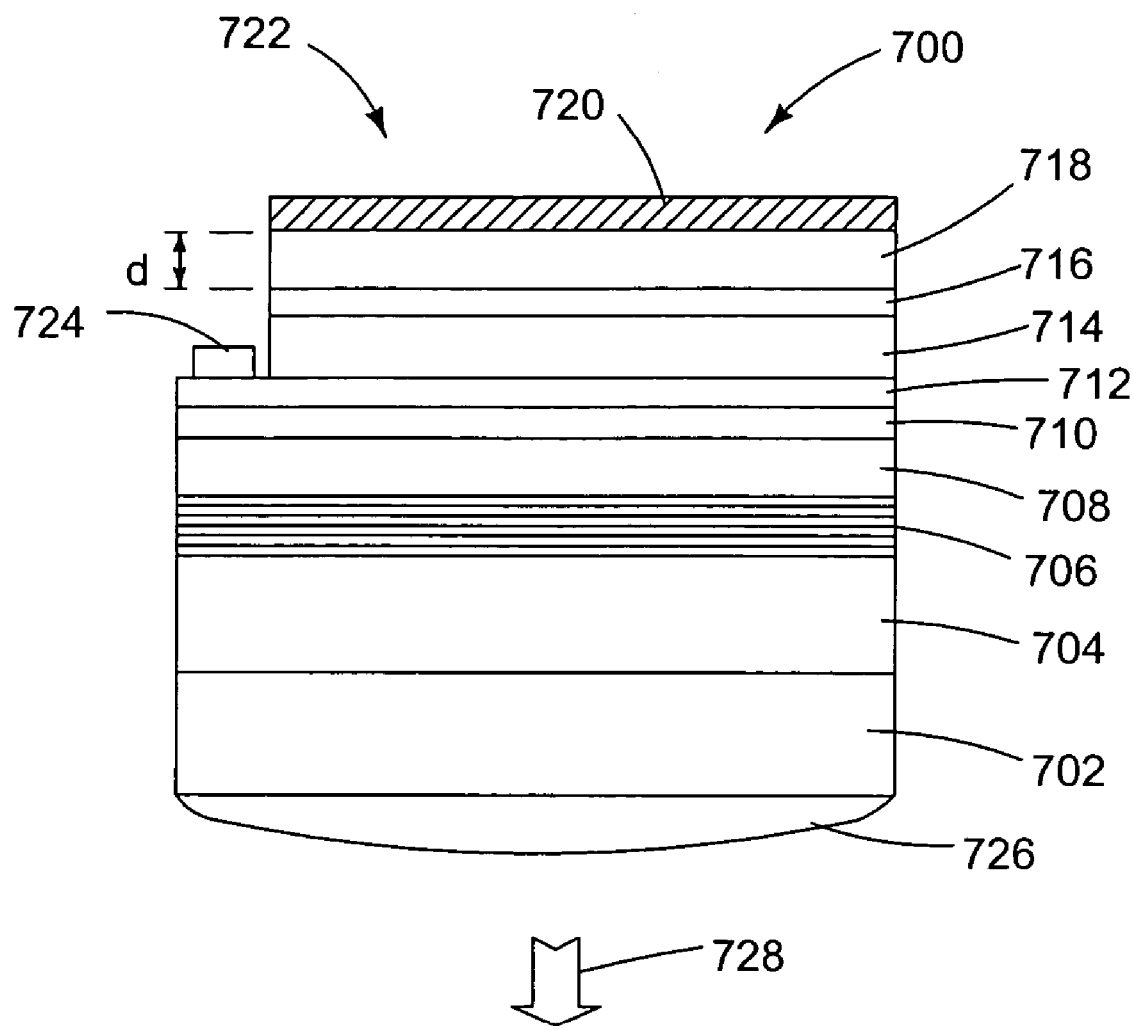
FIG. 7 is a cross-sectional view of a light emitting diode according to one embodiment of the present invention.

FIG. 7 is a cross-sectional view of the structure of an LED according to the present invention, which includes a cavity, multiple QWs and light output through the substrate's high-reflectivity mirror. The LED 700 is comprised of a transparent substrate 702 (e.g., sapphire), a GaN buffer 704, a DBR mirror 706 (or an arrow mirror), an undoped GaN layer 708, an optically-pumped QWs layer 710 emitting a complementary colored light, an undoped GaN layer 712, an n-GaN layer 714, a current-injected QWs layer 716, a p-GaN layer 718, and a high-reflectivity mirror 720. The high-reflectivity mirror 720 is also used as a p-contact 722, while an n-contact is placed on the undoped GaN layer 712. Epoxy 726 may be placed on the substrate 702 to provide fresnel reflectivity for the emitted light 728.

Figure 8A:
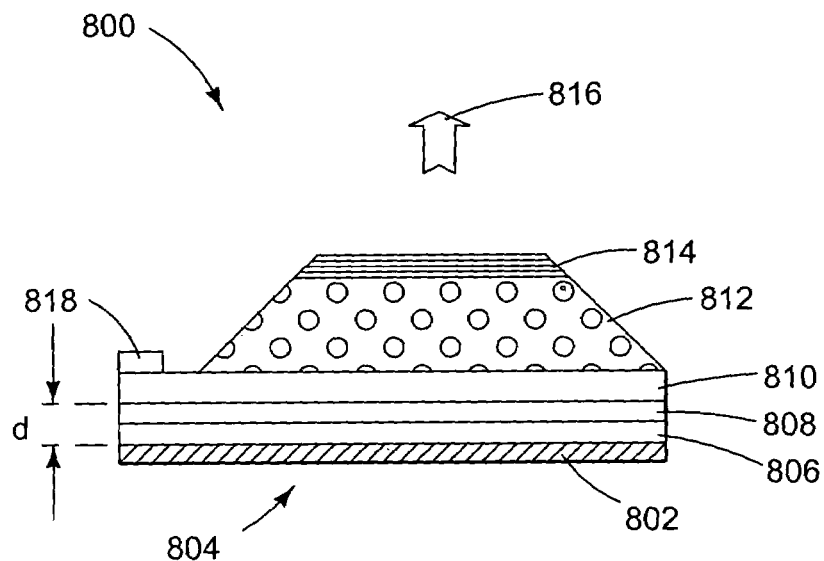
FIGS. 8A–8B are cross-sectional views of light emitting diodes according to one embodiment of the present invention.
Figure 8B:
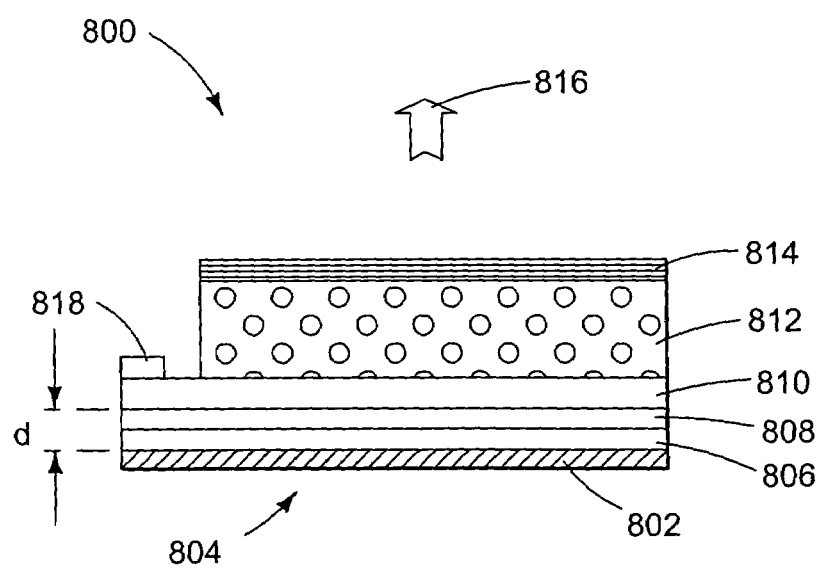

FIGS. 8A and 8B are cross-sectional views of the structure of LEDs according to the present invention, which include MCLEDs, blue QWs and QDs. Each LED 800 includes a high-reflectivity mirror 802, which is also used as a p-contact 804, a p-GaN layer 806, current-injected QWs layer 808, n-GaN layer 810, optically-pumped, directly-grown QDs layer 812 (which are used as the recycling emitter species instead of QWs), and DBR mirror 814 from which light 816 escapes, wherein the DBR mirror 814 is centered on the blue wavelength. The upper surface of the n-GaN layer 810 includes an n-contact 818. Note that the DBR mirror 814 could be replaced by epoxy, which would increase the escape cones for both wavelengths and the semiconductor-epoxy interface would act as a weak mirror (e.g., by means of fresnel reflectivity) to perform a weak micro-cavity effect, provided by the overall optical thickness in a number of $\lambda/2$ (including the metal dephasing of about $\lambda/4$).

Figure 9A:
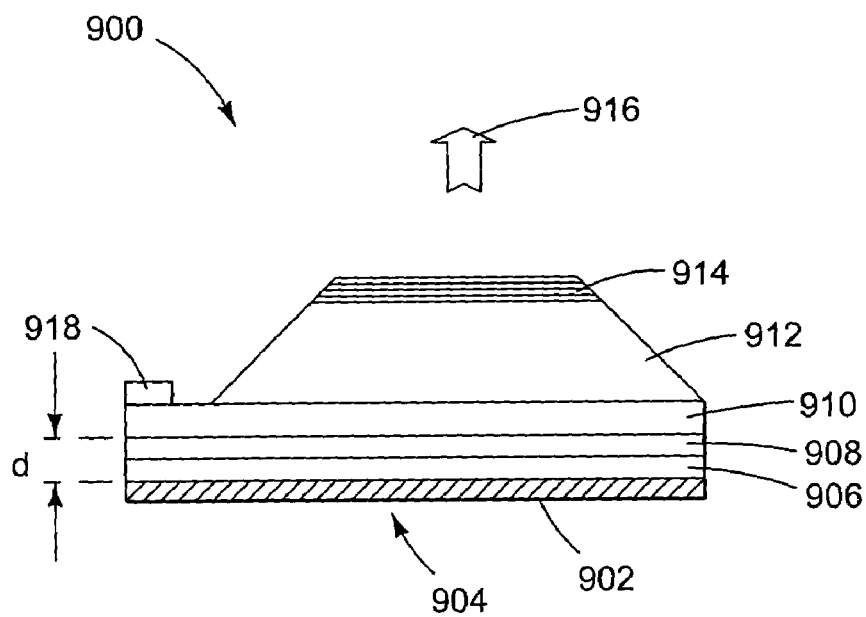
FIGS. 9A–9B are cross-sectional views of light emitting diodes according to one embodiment of the present invention.
Figure 9B:
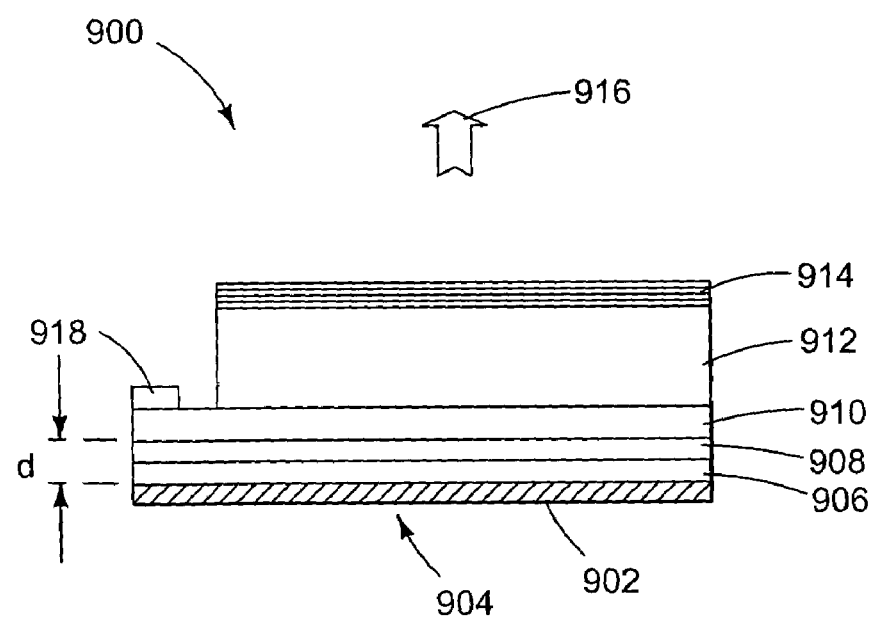

FIGS. 9A and 9B are cross-sectional views of the structure of LEDs according to the present invention, which include MCLEDs and phosphor layers. Each LED 900 includes a high-reflectivity mirror 902, which is also used as a p-contact 904, a p-GaN layer 906, current-injected QWs layer 908, n-GaN layer 910, phosphor 912 (emitting in complementary colors), and DBR mirror 914 from which light 916 escapes, wherein the DBR mirror 914 is centered on the blue wavelength. The upper surface of the n-GaN layer 910 includes an n-contact 918.

In this device, the phosphor 912 grains should be small enough to fit into a small order cavity. If only phosphor 912 is used on top of structure, with no mirror 914, the result is a textured surface that results in disordered scattering, thanks to the granularity of the phosphor 912 and its index difference with the matrix.

In addition, instead of putting a DBR mirror 914 on the top of the structure, epoxy may be used, which will increase the escape cones for both wavelengths. Moreover, the semiconductor-epoxy interface acts as a weak mirror (e.g., by means of fresnel reflectivity) to create a weak micro-cavity effect, which is provided by the overall optical thickness of $\lambda/2$ (including the metal dephasing of about $\lambda/4$).

Figure 10:
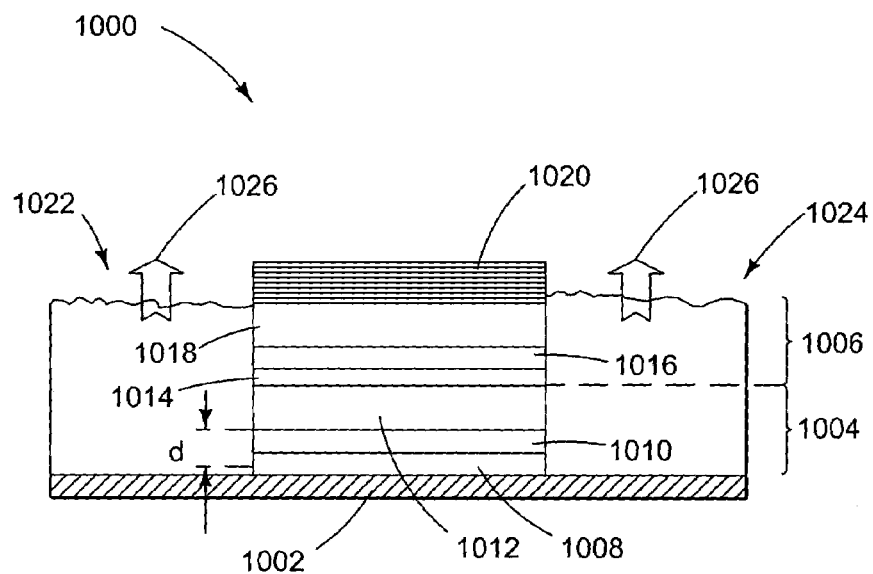
FIG. 10 is a cross-sectional view of a light emitting diode according to one embodiment of the present invention.

FIG. 10 is a cross-sectional view of the structure of an LED according to the present invention, which includes an MCLED and side textured surfaces for guided mode extraction. The LED 1000 includes a high-reflectivity mirror 1002, a doped first region 1004, and an undoped second region 1006. The doped first region 1004 includes a p-GaN layer 1008, current-injected QWs layer 1010 and n-GaN layer 1012. The undoped second region 1006 includes an undoped GaN layer 1014, optically-pumped QWs layer 1016, undoped GaN layer 1018, and DBR mirror 1020, wherein the DBR mirror 1020 is centered on the blue wavelength. The LED 1000 includes side textured surfaces 1022 and 1024 for lateral guided modes extraction. Note also that, in this structure, the optically-pumped QWs 1016 could be replaced by QDs, or any other source of light that can recycle the guided modes.

Simulation Results

Figure 11:
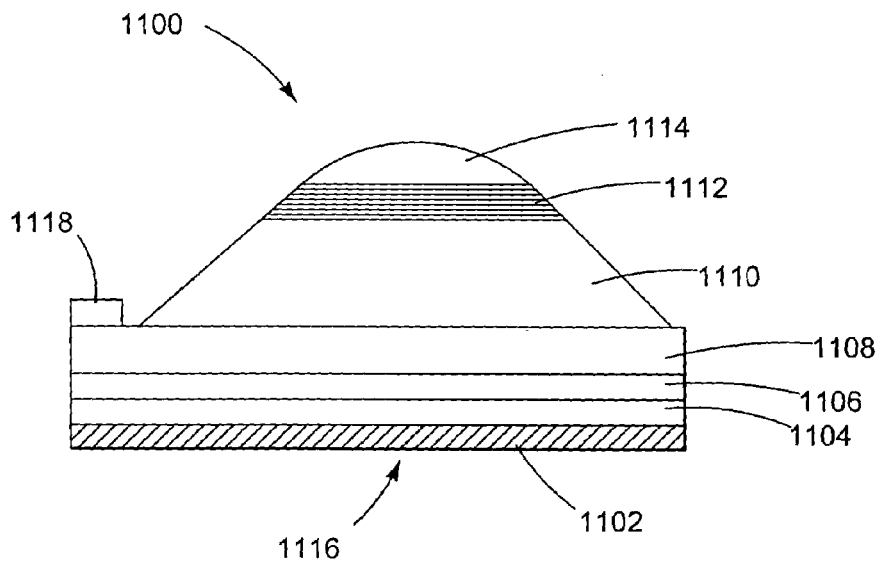
FIG. 11 is a cross-sectional view of a light emitting diode according to one embodiment of the present invention.

FIG. 11 is a cross-sectional view of the structure of an LED according to the present invention, which was used for the basis of simulation. The LED 1100 includes a high-reflectivity mirror 1102, p-GaN layer 1104, current-injected layer 1106, n-GaN layer 1108, optically-pumped layer 1110, DBR mirror 1112 and epoxy 1114. The high-reflectivity mirror 1102 is also used as a p-contact 1116, while an n-contact 1118 is placed on the n-GaN layer 1108. In this example, the size of the cavity for the device 1100 is 200 nm, and the position of the current-injected layer 1106 is $\lambda/4$ from the mirror 1102.

Figure 12B:
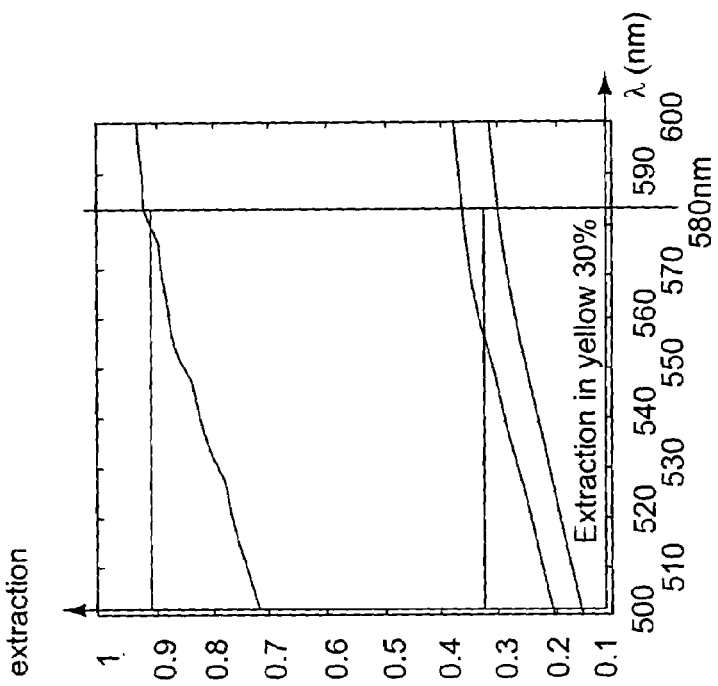
Figure 12A:
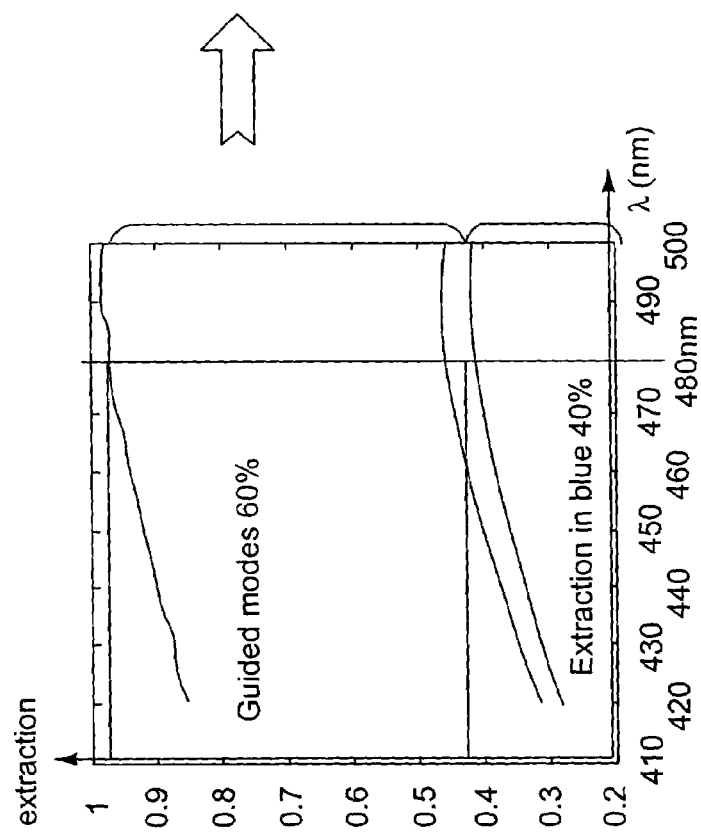

FIGS. 12A–12B are graphs showing the extraction percentage versus wavelength for the LED of FIG. 11, wherein FIG. 12A shows the emission from the current-injected layer, while FIG. 12B shows the emission from the optically-pumped layer. According to the graphs, the total light expected comprises 40% extraction in blue (FIG. 12A) and 18% extraction in yellow (FIG. 12B).

Figure 13:
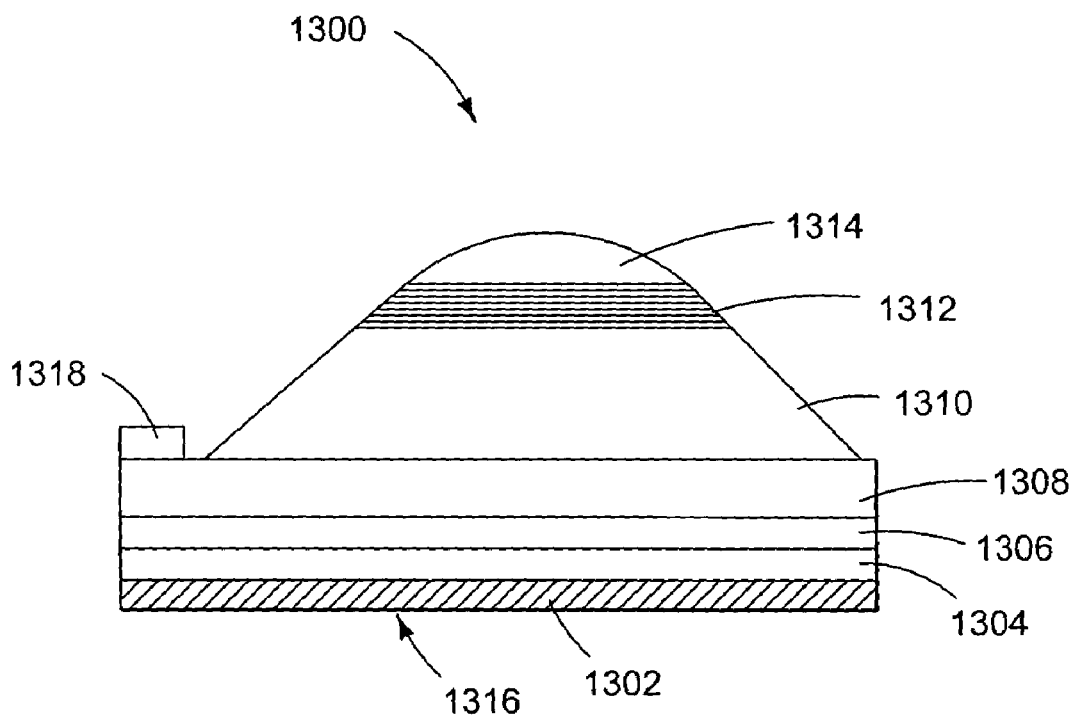
FIG. 13 is a cross-sectional view of a light emitting diode according to one embodiment of the present invention.

FIG. 13 is a cross-sectional view of the structure of an LED according to the present invention, which was used for the basis of simulation. The LED 1300 includes a high-reflectivity mirror 1302, p-GaN layer 1304, current-injected layer 1306, n-GaN layer 1308, optically-pumped layer 1310, DBR mirror 1312 and epoxy 1314. The high-reflectivity mirror 1302 is also used as a p-contact 1316, while an n-contact 1318 is placed on the n-GaN layer 1308. In this example, the size of the cavity for the device 1300 is 510 nm, and the position of the current-injected layer 1306 is $\lambda/4$ from the mirror 1302.

Figure 14:
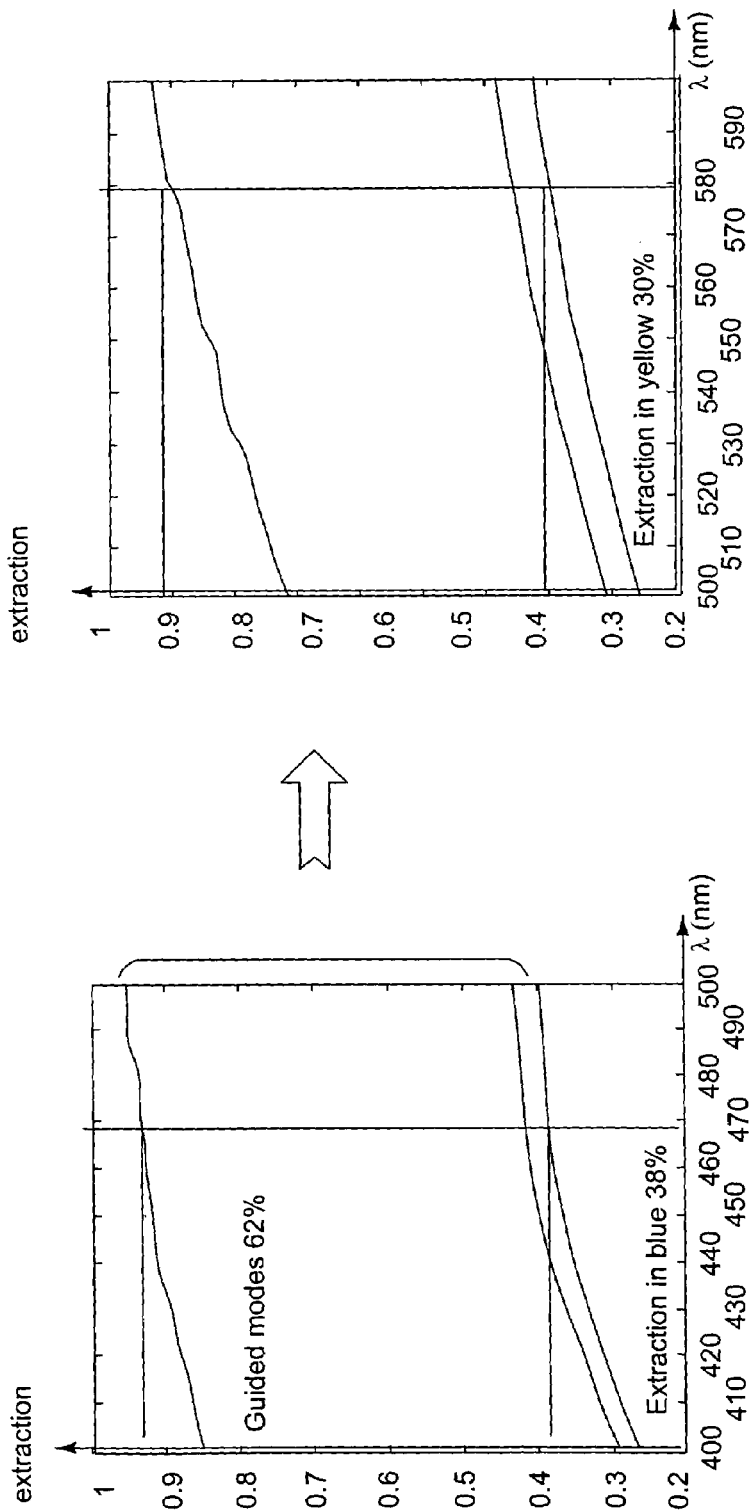

FIGS. 14A–14B are graphs showing the extraction percentage versus wavelength for the LED of FIG. 13, wherein FIG. 14A shows the emission from the current-injected layer, while FIG. 14B shows the emission from the optically-pumped layer. According to the graphs, the total light expected comprises 38% extraction in blue (FIG. 14A) and 19% extraction in yellow (FIG. 14B).

Note that the results presented are subjected to many hypothesis such as the internal quantum efficiency of the optically-pumped layer, the internal and metal losses, etc.

The previous calculation was made for a structure with phosphor; thus, for the second step, the phosphor is simulated as multiple isotropic sources (one source every 20 nm, the number depending on the size of the cavity). The simulation also considered a blue emission at 470 nm and a photon recycling with a source emitting at 580 nm.

Figure 15:
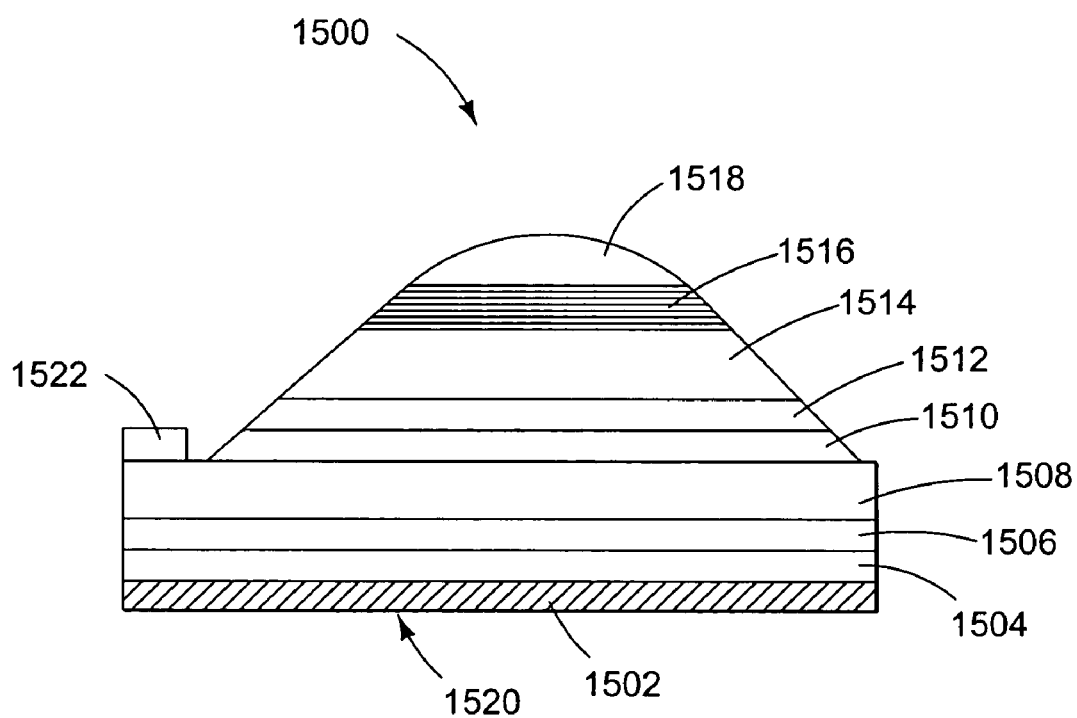
FIG. 15 is a cross-sectional view of a light emitting diode according to one embodiment of the present invention.

FIG. 15 is a cross-sectional view of the structure of an LED according to the present invention, which was used for the basis of simulation. The LED 1500 includes a high-reflectivity mirror 1502, p-GaN layer 1504, current-injected layer 1506, n-GaN layer 1508, undoped GaN layer 1510, optically-pumped layer 1512, undoped GaN layer 1514, DBR mirror 1516 and epoxy 1518. The high-reflectivity mirror 1502 is also used as a p-contact 1520, while an n-contact 1522 is placed on the n-GaN layer 1508. The size of the cavity for the device 1500 is 510 nm, the position of the current-injected layer 1506 is $\lambda/4$ from the mirror 1502, and the position of the optically-pumped layer 1512 is 300 nm from the DBR 1516.

FIGS. 16A–16B are graphs showing the extraction percentage versus wavelength for the LED of FIG. 15, wherein FIG. 16A shows the emission from the current-injected layer, while FIG. 16B shows the emission from the optically-pumped layer. According to the graphs, the total light expected comprises 35% extraction in blue (FIG. 16A) and 18% extraction in yellow (FIG. 16B).

Modifications and Variations

Instead of using quantum wells to recycle guided modes, many other types of highly photoluminescent materials may be used, such as:

quantum dots, phosphors, dyes, light emitting polymers, light emitting molecules, or InGaN (Zn:Si) with luminescence based on donor-acceptor pairs, as described above.

In addition, LEDs of different colors may be constructed by mixing complementary-color materials. Monocolor LEDs can also be improved by using QWs as the photo-pumped species, with the same or slightly downwards shifted energies.

When using QWs with poor efficiency due to internal electric fields, such as resulting from piezo effects in nitrides, a bias electrode may be used to enhance the internal quantum efficiency of that optically-pumped QWs without injecting current.

When the converted light does not have enough power to meet LED color requirements, current injection can be used in the so-called optically-pumped layers to increase intensity, either using a common set of electrodes with the main electrically pumped species or independent electrodes.

Although the present invention has described two-region structures, other structures may be used as well, so long as they are based on the concept of guided mode recycling. For example, three-region structures would recycle two main guided modes, and other multiple-region structures would operate in a like manner.

The advantage of photon recycling by adding layers versus micro-cavity effects or light randomization depends on variables such as internal losses, internal quantum efficiency, etc., which depend on the device under consideration. Still, the concepts of the present invention allow the use of a wide variety of excellent photoluminescent materials that are not amenable to high-efficiency electroluminescence.

All the concepts described herein are also applicable to LEDs based on other materials, and in particular, those leading to mono-color LEDs, such as those based on the GaAlInAsP materials system. The concepts described herein are also relevant to emitters and displays based on organic molecules and electroluminescent polymers, and their combinations to other materials.

REFERENCES

The following references are incorporated by reference herein:

1. I. Schnitzer, and E. Yablonovitch, "30% External Quantum Efficiency From Surface Textured, Thin Film Light Emitting Diode," Applied Physics Letters 63, page 2174–2176, (1993).
2. M. Boroditsky, E. Yablonovitch, "Light extraction efficiency from light-emitting diodes," Proceedings of the SPIE—The International Society for Optical Engineering, SPIE-Int. Soc. Opt. Eng., 3002. p. 119–122, 1997.
3. H. Benisty, H D. Neve, and C. Weisbuch, "Impact of planar micro-cavity effects on light extraction—basic concepts and analytical trends," IEEE J. Quantum Electron, vol. 34, p. 1612 (1998).
4. D. Delbeke, R. Bockstaele, P. Bienstman, R. Baets, and H. Benisty, "High-efficiency Semiconductor Resonant-Cavity Light-Emitting diodes: A review," IEEE J. on selected topic in Quantum Electron, vol. 8, no. 2, p. 189, (2002).
5. X. Guo, J. W. Graff, and E. F. Schubert, "Photon Recycling Semiconductor Light Emitting diode," IEDM Technical Digest, IEDM-99, p. 600, 1999.
6. U.S. Pat. No. 6,538,371, to Duggal, et al., issued Mar. 25, 2003, and entitled White light illumination system with improved color output.
7. U.S. Pat. No. 6,525,464, to Chin, issued Feb. 25, 2003, and entitled Stacked light-mixing LED.
8. U.S. Pat. No. 6,504,180, to Heremans, et al., issued Jan. 7, 2003, and entitled Method of manufacturing surface textured high-efficiency radiating devices and devices obtained therefrom.
9. U.S. Pat. No. 6,163,038, to Chen, et al., issued Dec. 19, 2000, and entitled White light-emitting diode and method of manufacturing the same.
10. U.S. Pat. No. 5,779,924, to Krames, et al., issued Jul. 14, 1998, and entitled Ordered interface texturing for a light emitting device.
11. U.S. Pat. No. 5,362,977, to Hunt, et al., issued Nov. 8, 1994, and entitled Single mirror light-emitting diodes with enhanced intensity.
12. U.S. Pat. No. 5,226,053, to Cho, et al., issued Jul. 6, 1993, and entitled Light emitting diode.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A light emitting diode (LED), comprising:
   a first active region comprised of one or more current-injected layers for emitting photons when electrically biased in a forward direction; and
   a second active region, adjacent the first active region, comprised of one or more optically-pumped layers for emitting photons, wherein the optically-pumped layers are optically excited by the photons emitted by the current-injected layers, thereby recycling guided modes within the LED.
2. The LED of claim 1, wherein the LED comprises a white, single or multi-color LED.
3. The LED of claim 1, wherein the first active region is comprised of doped materials and the second active region is comprised of undoped materials.
4. The LED of claim 1, wherein the current-injected layers are comprised of emitters such as quantum wells (QWs) or quantum dots (QDs).
5. The LED of claim 1, wherein the optically-pumped layers comprise electrically-passive layers.
6. The LED of claim 1, wherein the optically-pumped layers are comprised of emitters such as quantum wells (QWs), quantum dots (QDs), phosphors, dyes, light emitting polymers, or other light emitting molecules.
7. The LED of claim 1, wherein any color of light is achieved by combining emitters at desired wavelengths.
8. The LED of claim 1, wherein the optically-pumped layers are optically-pumped by the guided modes of the current-injected layers, absorb the guided modes and re-emit the absorbed guided modes at the same or different wavelengths.
9. The LED of claim 8, wherein the optically-pumped layers emit photons at the same or different wavelengths as the current-injected layers.
10. The LED of claim 1, wherein the photons emitted by the optically-pumped layers escape the LED as emitted light through an output interface comprising a textured surface, a distributed Bragg reflector (DBR), or an epoxy structure.
11. The LED of claim 10, further comprising an epoxy added on the output interface to increase an escape cone for the emitted light.
12. The LED of claim 1, wherein the first and second active regions are close and are not separated by a substrate in order to achieve an efficient recycling.
13. The LED of claim 1, further comprising a mirror, adjacent the first active region, that reflects an energy flux from the first active region and thus multiplies the photons emitted from the current-injected layers that optically excite the optically-pumped layers in the second active region.
14. The LED of claim 13, wherein the mirror is a contact layer.
15. The LED of claim 13, wherein the current-injected layer lies at an antinode of an electric field of an optical wave to the mirror to enhance coupling effects.
16. The LED of claim 13, wherein a value d represents a distance between the mirror and the first active region, such that:

$$d=\lambda/4 \text{ or } \lambda/4+n\ \lambda/2 \text{ approximately for a metallic mirror, or}$$

$$d=\lambda/2 \text{ or } \lambda/2+n\ \lambda/2 \text{ for a distributed Bragg reflector (DBR) mirror,}$$

where $\lambda$ is a wavelength of an optical wave.

17. The LED of claim 13, wherein a thickness of the first acrive region is adjusted so as to obtain a micro-cavity enhancement effect due to reflections at the mirror and at an interface between the first and second active regions.
18. The LED of claim 1, wherein current injection is used in the optically-pumped layers to increase intensity.
19. A method of creating a light emitting diode (LED), comprising:
   creating a first active region comprised of one or more current-injected layers for emitting photons when electrically biased in the forward direction; and
   creating a second active region, adjacent the first active region, comprised of one or more optically-pumped layers for emitting photons, wherein the optically-pumped layers are optically excited by the photons emitted by the current-injected layers, thereby recycling guided modes within the LED.

20. The method of claim 19, wherein the LED comprises a white, single or multi-color LED.

21. The method of claim 19, wherein the first active region is comprised of doped materials and the second active region is comprised of undoped materials.

22. The method of claim 19, wherein the current-injected layers are comprised of emitters such as quantum wells (QWs) or quantum dots (QDs).

23. The method of claim 19, wherein the optically-pumped layers comprise electrically-passive layers.

24. The method of claim 19, wherein the optically-pumped layers are comprised of emitters such as quantum wells (QWs), quantum dots (QDs), phosphors, dyes, light emitting polymers, or other light emitting molecules.

25. The method of claim 19, wherein any color of light is achieved by combining emitters at desired wavelengths.

26. The method of claim 19, wherein the optically-pumped layers are optically-pumped by the guided modes of the current-injected layers, absorb the guided modes and re-emit the absorbed guided modes at the same or different wavelengths.

27. The method of claim 19, wherein the optically-pumped layers emit photons at the same or different wavelengths as the current-injected layers.

28. The method of claim 19, wherein the photons emitted by the optically-pumped layers escape the LED as emitted light through an output interface comprising a textured surface, a distributed Bragg reflector (DBR), an epoxy structure, or other structure.

29. The method of claim 28, further comprising adding epoxy on the output interface to increase an escape cone for the emitted light.

30. The method of claim 19, wherein the first and second active regions are close and are not separated by a substrate in order to achieve an efficient recycling.

31. The method of claim 19, further comprising creating a mirror, adjacent the first active region, that reflects an energy flux from the first active region and thus multiplies the photons emitted from the current-injected layers that optically excite the optically-pumped layers in the second active region.

32. The method of claim 31, wherein the mirror is a contact layer.

33. The method of claim 31, wherein the current-injected layer lies at an antinode of an electric field of an optical wave to the minor to enhance coupling effects.

34. The method of claim 31, wherein a value d represents a distance between the mirror and the first active region, such that:

$d=\lambda/4$ or $\lambda/4+n\lambda/2$ approximately for a metallic mirror, or $d=\lambda/2$ or $\lambda/2+n\lambda/2$ for a distributed Bragg reflector (DBR) mirror, where $\lambda$ is the wavelength of the optical wave.

35. The method of claim 31, wherein a thickness of the first region is adjusted so as to obtain a micro-cavity enhancement effect due to reflections at the mirror and at an interface between the first and second regions.

36. The method of claim 19, wherein current injection is used in the optically-pumped layers to increase intensity.

37. A white, single or multi-color light emitting diode (LED), comprising:
a minor for reflecting photons within the LED;
a first active region, adjacent the mirror, comprised of one or more current-injected layers for emitting photons when electrically biased in a forward direction;
a second active region, adjacent the first active region, comprised of one or more optically-pumped layers for emitting photons, wherein the optically-pumped layers are optically excited by the photons emitted by the current-injected layers, thereby recycling guided modes within the LED; and
an output interface, adjacent the second active region, for allowing the photons emitted byte optically-pumped layers to escape the LED.

38. The LED of claim 37, wherein the first active region is comprised of doped materials and the second active region is comprised of undoped materials.

39. The LED of claim 37, wherein the current-injected layers are comprised of emitters such as quantum welts (QWs) or quantum dots (QDs).

40. The LED of claim 37, wherein the optically-pumped layers comprise electrically-passive layers.

41. The LED of claim 37, wherein the optically-pumped layers are comprised of emitters such as quantum wells (QWs), quantum dots (QDs), phosphors, dyes, light emitting polymers, or other light emitting molecules.

42. The LED of claim 37, wherein any color of light is achieved by combining emitters at desired wavelengths.

43. The LED of claim 37, wherein the optically-pumped layers are optically-pumped byte guided modes of the current-injected layers, absorb the guided modes and re-emit the absorbed guided modes at the same or different wavelengths.

44. The LED of claim 43, wherein the optically-pumped layers emit photons at the same or different wavelengths as the current-injected layers.

45. The LED of claim 37, wherein the output interface comprises a textured surface, a distributed Bragg reflector (DBR), or an epoxy structure.

46. The LED of claim 37, wherein the first and second active regions are close and are not separated by a substrate in order to achieve an efficient recycling.

47. The LED of claim 37, wherein the mirror reflects an energy flux from the first active region and thus multiplies the photons emitted from the current-injected layers tat optically excite the optically-pumped layers in the second active region.

48. The LED of claim 37, wherein the minor is a contact layer.

49. The LED of claim 37, wherein the current-injected layer lies at an antinode of an electric field of an optical wave to the mirror to enhance coupling effects.

50. The LED of claim 37, wherein a value d represents a distance between the mirror and the first active region, such that:

$d=\lambda/4$ or $\lambda/4+n\lambda/2$ approximately for a metallic mirror, or $d=\lambda/2$ or $\lambda/2+n\lambda/2$ for a distributed Bragg reflector (DBR) mirror, where $\lambda$ is a wavelength of an optical wave.

51. The LED of claim 37, wherein a thickness of the first active region is adjusted so as to obtain a micro-cavity enhancement effect due to reflections at the mirror and at an interface between the first and second active regions.

52. The LED of claim 37, wherein current injection is used in the optically-pumped layers to increase intensity.

* * * * *

UNITED STATES PATENT AND TRADEMARK OFFICE
CERTIFICATE OF CORRECTION

PATENT NO. : 7,223,998 B2
APPLICATION NO. : 10/938704
DATED : May 29, 2007
INVENTOR(S) : Schwach et al.

It is certified that error appears in the above-identified patent and that said Letters Patent is hereby corrected as shown below:

Column 12:

Claim 17, line 54 please delete "acrive" and insert --active--;

Column 13:

Claim 37, line 66, please delete "minor" and insert --mirror--;

Column 14:

Claim 43, line 27, please delete "byte" and insert --by the--; and

Claim 48, line 45, please delete "minor" and insert --mirror--.

Signed and Sealed this

Sixteenth Day of November, 2010

David J. Kappos
*Director of the United States Patent and Trademark Office*